United States Patent [19]

Weber et al.

[11] Patent Number: 5,122,757
[45] Date of Patent: Jun. 16, 1992

[54] DIGITAL FREQUENCY GENERATOR

[75] Inventors: Hubert Weber, Eckental; Volker Thamm, Nuremberg, both of Fed. Rep. of Germany

[73] Assignee: U.S. Philips Corp., New York, N.Y.

[21] Appl. No.: 673,841

[22] Filed: Mar. 18, 1991

Related U.S. Application Data

[63] Continuation of Ser. No. 409,481, Sep. 19, 1989, abandoned.

[30] Foreign Application Priority Data

Sep. 22, 1988 [DE] Fed. Rep. of Germany ....... 3832152

[51] Int. Cl.⁵ .......................... H03K 5/13; H03K 3/00
[52] U.S. Cl. .................................. 328/158; 307/511; 328/61
[58] Field of Search ................. 307/262–269, 307/511; 328/60, 61, 63, 155; 377/108, 115, 116

[56] References Cited

U.S. PATENT DOCUMENTS

| | | | |
|---|---|---|---|
| 2,881,320 | 4/1959 | Goldberg | 250/36 |
| 3,292,100 | 12/1966 | Berlind | 307/262 |
| 3,581,115 | 5/1971 | Weber | 307/262 |
| 4,485,479 | 11/1984 | Lino et al. | 328/155 |
| 4,562,402 | 12/1985 | Irvin | 328/155 |
| 4,617,679 | 10/1986 | Brooks | 375/119 |
| 4,862,096 | 8/1989 | Spence | 328/155 |
| 4,868,428 | 7/1989 | Cooper | 307/529 |
| 4,935,701 | 6/1990 | Kawai et al. | 307/511 |

OTHER PUBLICATIONS

J. D. H. Alexander, "Logical Phase-Controlled Oscillator", Electronics Letters, vol. 11, No. 22, Oct. 30, 1975, pp. 540–541.

*Primary Examiner*—David Hudspeth
*Assistant Examiner*—Andrew Sanders
*Attorney, Agent, or Firm*—Jack D. Slobod

[57] ABSTRACT

A digital frequency generator is formed from generators for fist and second clock signals which feed a frequency adder stage that produces an output having a frequency of the sum of the frequency of the second clock signal and one half the frequency of the first clock signal. The frequency adder stage is formed from a phase shifter which produces four different phases, each at a frequency of the first clock signal divided by two, and a multiplexer which selects phases under the control of a sequence controller supplying an address signal thereto. The sequence controller is fed from the first and second clock signals and produces in an address counter a sequence of count states synchronously with edges of the first clock signal after an ascending edge of the second clock signal. The count state of the address counter determines the selected phase. The pattern of selected phases during said sequence of count states is such that the output of the multiplexer exhibits four sequential asymmetrical cycles each spanning one and one half cycles of the first clock signal, while before and after said sequence of count states the same phase is selected to produce at the output of the multiplexer symmetrical sequential cycles each spanning two cycles of the first clock signal.

6 Claims, 2 Drawing Sheets

Fig. 1

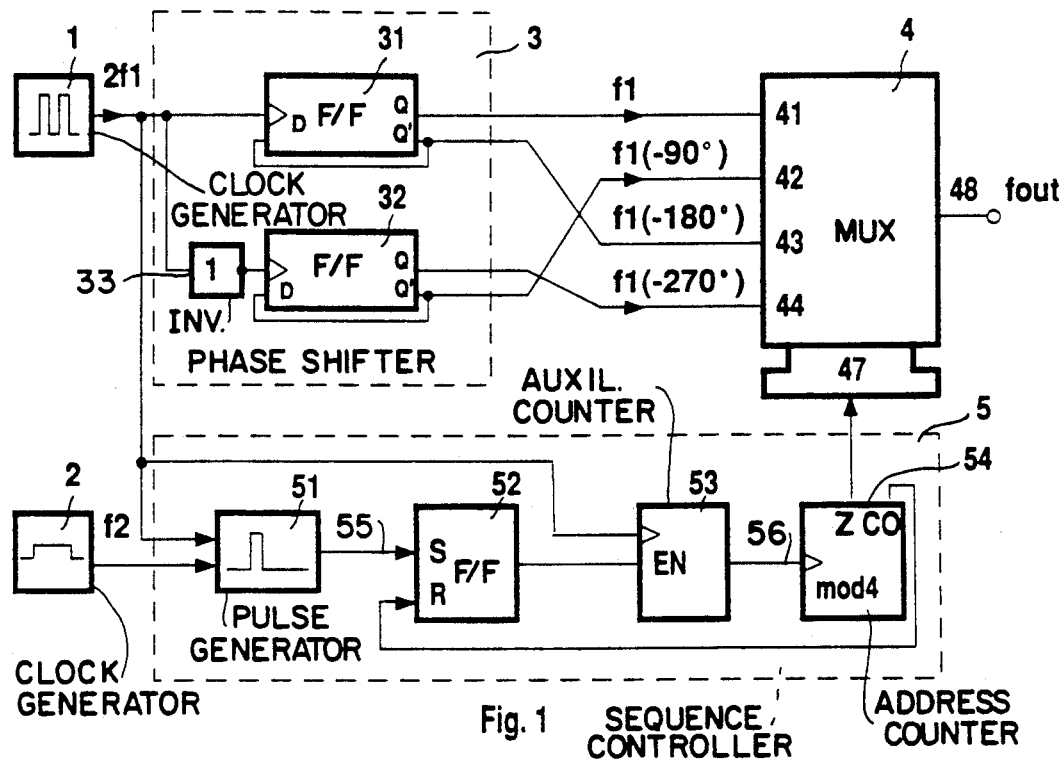
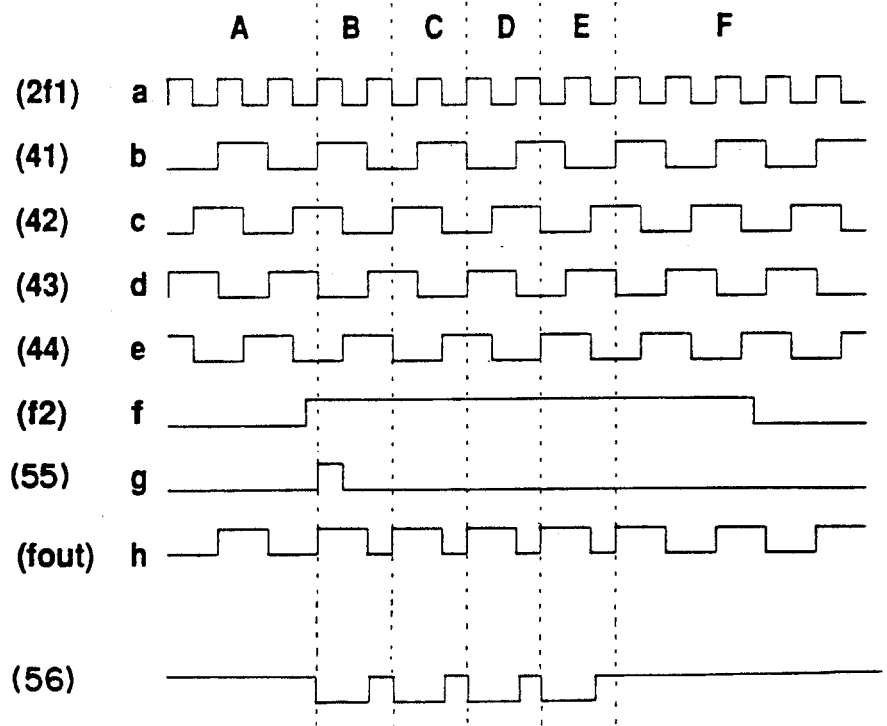
Fig. 2

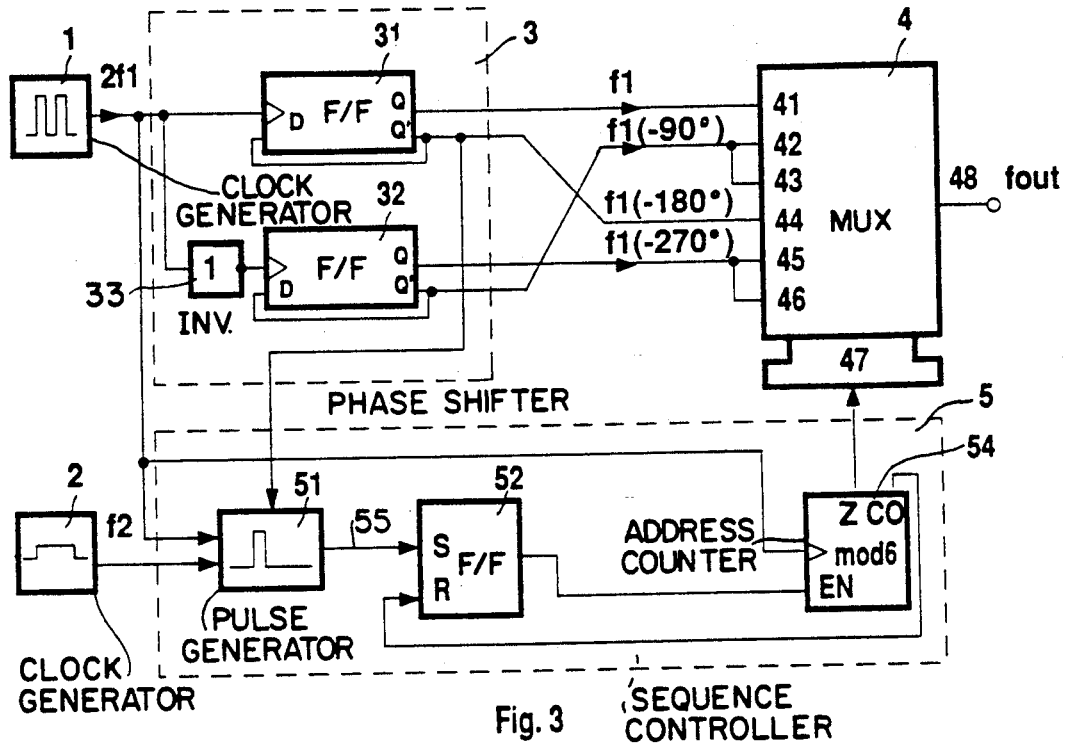
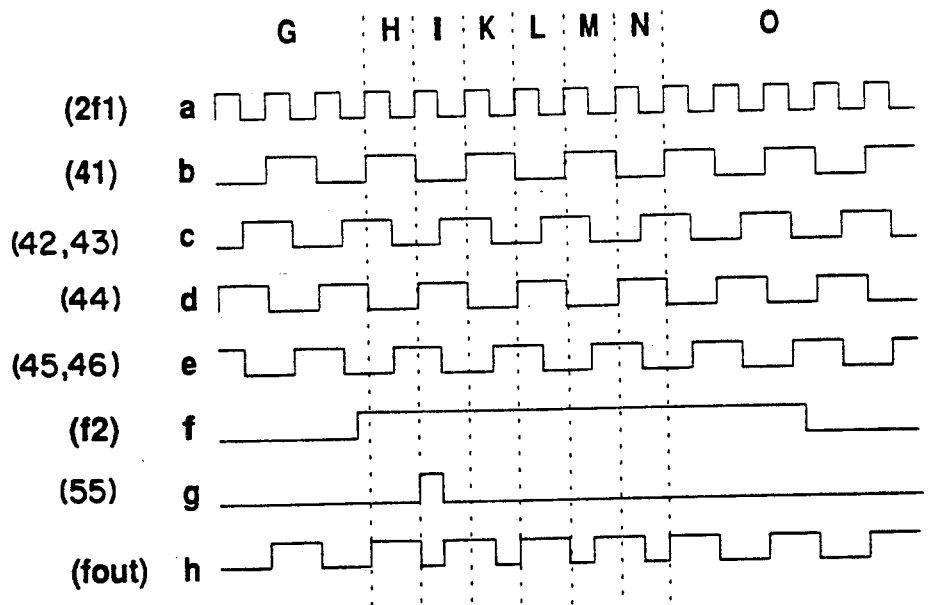
Fig. 4

DIGITAL FREQUENCY GENERATOR

This is a continuation of application Ser. No. 409,481, filed Sep. 19, 1989 abandon.

BACKGROUND OF THE INVENTION

1. Field of the Invention

This invention relates to a digital frequency generator which includes first and second clock generators and a frequency adder stage.

2. Description of the Related Art

U.S. Pat. No. 4,308,619 discloses a phase control stage comprising an adder circuit for two clock signals having two different frequencies. The two clock signals to be added up are applied to a D flip-flop and a NOR gate. Such a circuit arrangement ensures that even with partly or completely overlapping pulses of the two clock signals to be added up the sum of the two clock signals is formed exactly.

Averaged over various periods of the low-frequency clock signal, the exact sum of the frequencies of the two clock signals is obtained in this manner. Within a period of the low-frequency clock signal the distribution of the clock edges over the period of this clock signal is inhomogeneous.

SUMMARY OF THE INVENTION

It is an object of the present invention to provide a circuit arrangement of the type mentioned in the opening paragraph, which has a more even distribution of the clock edges in the output signal.

This object is achieved in that the frequency adder stage comprises a phase shifter, an adder and a multiplexer.

In a preferred embodiment a first clock signal is applied to the phase shifter which always generates n output signals phase shifted by 1/n period which are applied to the multiplexer and in that a second clock signal is applied to a first control input of the counter, whose outputs are connected to the control input of the multiplexer.

BRIEF DESCRIPTION OF THE DRAWING

The invention will now be further described and explained by means of an exemplary embodiment shown in the drawing, in which:

FIG. 1 is a schematic diagram of an embodiment of the invention,

FIG. 2 shows waveforms of signals at identified points in the schematic diagram of FIG. 1

FIG. 3 is a schematic diagram a further embodiment of the invention and

FIG. 4 shows waveforms of signals at identified points in the schematic diagram of FIG. 3.

FIG. 1 shows a preferred embodiment of the invention. A first clock generator 1 and a second clock generator 2 produce two clock signals 2f1 and f2. The variation in time of the first clock signal 2f1 is shown in FIG. 2, line a, that of the second clock signal f2 in FIG. 2, line f. The clock signal 2f1 of the first clock generator is applied to an input of a phase shifter 3. In the embodiment the phase shifter 3 comprises first and second D flip-flops 31 and 32 and an inverter 33. Each D flip-flop 31, 32 has a clock input, a D input, a non-inverting output Q and an inverting output Q'. A clock signal of the first clock generator 1 is directly applied to the clock input of the first D flip-flop 31 and to the clock input of the second D flip-flop 32 via the inverter 33. The inverting outputs Q' of the D flip-flops 31, 32 are connected to the D inputs of these same flip-flops. The clock signals that can be tapped from the outputs of the D flip-flops 31, 32 thus have only half the frequency of the clock signals applied to their inputs. Compared to the clock signal f1, which can be tapped from the non-inverting output of the first D flip-flop 31, the phase of the clock signal f1 (−90°), which can be tapped from the inverting output Q' of the second D flip-flop 32, lags by 90°, the phase of the clock signal f1 (−180°), which can be tapped from the inverting output Q' of the first D flip-flop 31, lags by 180°, and the phase of the clock signal f1 (−270°), which can be tapped from the non-inverting output Q of the second D flip-flop 32, lags by 270°. The variation in time of these four clock signals is shown by means of the lines b to e in the FIG. 2. These four clock signals are applied to the first, second, third and fourth inputs 41, 42, 43, 44 of a multiplexer 4, in that order. One of these phase shifter output clock signals can be selected each time by accordingly actuating address parallel input 47 of the multiplexer 4.

The first clock signal 2f1 of the first clock generator 1 as well as the second clock signal f2 of the second generator 2 are applied to a sequence controller 5. In the embodiment of the invention this sequence controller comprises a pulse generator 51, an RS flip-flop 52, an auxiliary counter 53 and an address counter 54. The pulse generator receives the clock signals 2f1 and f2 from the first and second clock generators 1, 2. The pulse generator 51 synchronizes the second clock signal f2 with a first clock signal 2f1, so as to produce after each ascending edge of a pulse having a pulse length spanning the time between the next ascending and descending edges of the first clock signal. In FIG. 2, line f represents the variation in time of the clock signal f2 and beneath this, line g represents the control pulse which can be tapped from the output 55 of the pulse generator 51. The control pulse is applied to the set input S of the RS flip-flop 52. The output of the RS flip-flop 52 is connected to an enable input EN of the auxiliary counter 53. First clock signal 2f1 of the first clock generator 1 is applied to the clock input of the auxiliary counter. Each time after three clock edges of 2f1 (both ascending and descending), the auxiliary counter 53 produces at its outputs an output pulse which is applied to the input of the address counter 54 (see line i of FIG. 2). The count output Z of the address counter 54 is connected to the address inputs 47 of the multiplexer 4. The address counter 54 is a modulo-4-counter producing at a transmit output CO a carry pulse when changing from the count state. Three to the count state Zero, which carry pulse is applied to a reset input R of the RS flip-flop 52. As will become clear as the discussion proceeds, this results in a sequence of three output pulses produced at the output 56 of counter 53 plus a fourth pulse which merges into a return of the signal at output 56 to an initial high state.

As long as the input clock of the second clock generator 2 is inactive (phase A in FIG. 2), the RS flip-flop 52 is reset and the address counter 54 indicates zero. Consequently, first input 41 of the multiplexer 4 is switched through to output 48 of the multiplexer. Once the clock signal f2 changes to its active state, the pulse generator 51 produces a control pulse setting the RS flip-flop 52. This operation actuates the auxiliary counter. In response to the descending edge of each pulse produced at the output 56 of the auxiliary counter 53, (each pulse being produced after three clock edges, ascending and descending as aforementioned) the address counter 54 is incremented by one unit. After four pulses have been applied to address counter 54 carry, the pulse of the address counter 54 will have reset the RS flip-flop 52 until a new pulse from the pulse generator 51 arrives. By considering time divided into sequential phases A through F, it should be noted that from inspection of FIG. 2 that as a result of the counts of the address counter, the first input 41 (during phases A and B), the second input 42 (during phase C), the third input 43 (during phase D), the fourth input 44 (during phase E) and again the first input 41 (during phase F) of the multiplexer are switched through to its output. Consequently, the output signal "fout" is formed from the successive phase-shifted clock signals at inputs 41-44. FIG. 2, line h, shows the output signal "fout". The signal variation shows that in the phases B, C, D, E the low portions of the output clock signal have been shortened by half relative to the high portions and in this way four shortened periods have developed in the time of three clock signal periods. Thus the signal variation can be made uniform and frequency components which are higher in the meantime are forced to a lower frequency.

In the described embodiment of the invention each cycle of signal f2 produces an additional cycle in $f_{out}$ over six periods of 2f1. The larger the number of periods of 2f1 over which the addition of a cycle can be stretched, the larger the uniformity resulting from the output signal becomes as a result of the addition of the frequency of the second clock signal. For this purpose the address counter is to have as many count states as the number n of phase-shifted clock signals produced by the phase shifter 3. The auxiliary counter is to produce an output pulse after each n-1 clock edges, both ascending and descending clock signal 2f1.

When changing the inputs of the multiplexers in reverse order or by reversing the counting direction of the address counter an output signal fout is formed having a frequency which is, the difference between the frequencies of the two clock signals f1 and f2 rather their sum. Also when subtracting the frequencies of these two clock signals from each other a uniform signal variation is achieved in an advantageous way.

In the embodiment described hereinbefore the number of inputs of the multiplexer 4 corresponded with a number of output signals produced by the phase shifter 3. The structure of the auxiliary counter 53, counting both ascending and descending clock edges, is slightly costly under specific circumstances, especially at high frequencies.

In a further embodiment of the invention the number of inputs of the multiplexer 4 exceeds the number of the output signals of the phase shifter 3. Various inputs of the multiplexer are then occupied more than once by the same input signals.

FIG. 3 shows an exemplary embodiment whose circuit arrangement, in so far it is not expressly stated hereinafter, corresponds with the circuit arrangement of the exemplary embodiment shown in FIG. 1.

In this embodiment the multiplexer 4 has six inputs 41, 42, 43, 44, 45, 46. The first input 41 of the multiplexer 4 is again connected to the non-inverting output of the first D flip-flop 31. The second and third inputs 42, 43 of the multiplexer 4 each receive the clock signal f (−90°) which lags in phase by 90°. The fourth input 44 of the multiplexer 4 receives the clock signal f1 (−180°) lagging in phase by 180°, and the fifth and sixth inputs 45, 46 receive the clock signal f1 (−270°) lagging in phase by 270°. Owing to the six inputs the address counter 54 is now arranged as a modulo-6-counter.

In this circuit arrangement an auxiliary counter is not required. The output signal 2f1 of the clock generator 1 is applied as a clock signal to the address counter 54. The enable-input EN of this address counter 54 is connected to the output of the RS flip-flop 52. Furthermore, the signal f1 (−180°) lagging in phase by 180°, is applied to the pulse generator 51. The pulse generator 51 in this embodiment is structured such that it produces an output pulse after each ascending clock edge of the output signal f2 of the second clock generator 2 exactly when the clock signal f1 (−180°) has a first ascending clock edge after the ascending clock of f2. The address counter 54 is incremented with each ascending clock edge of the clock signal 2f1 of the first clock generator. This is effected for the first time in the phase I when the clock signal of the pulse generator 51 represented in FIG. 4, line g, sets the RS flip-flop and thus the enable-input of the counter 54 is released. The counter 54 then passes through all six count states in which each time the corresponding input of multiplexer 4 is switched to its output. After the six count states have been passed through the count state of the address counter 54 is again reset to zero and the output carry pulse at its transmit output CO resets the RS flip-flop 52. In this way, output signal $f_{out}$ at multiplexer output 48, during phases G and H is the clock signal f1, during the phases I and K is the clock signal f1 (−90°), during the phase L is the clock signal f1 (−180°), and during the phases M and N is the clock signal f1 (−270°). Finally, in the phase O again the clock signal f1, is switched through to the output 48 of the multiplexer 4.

Line h of FIG. 4 shows the output signal of the multiplexer 4 which signal is divided into the sequential time phases G-O. This output signal precisely corresponds in form with the output signal of the multiplexer 4 of the first embodiment. The cost of the circuitry of the additional inputs to the multiplexer is less than the cost of an auxiliary counter, which can be saved in this manner. For the rest the advantages discussed above are maintained.

In a further embodiment (not shown) a multiplexer is used whose number of inputs corresponds exactly with the number of different signals produced by phase shifter 3. An address counter is utilized having a number of count states, exceeding the number of inputs of the multiplexer. Depending on the type of multiplexer, address encoding logic is arranged intermediate the output A of counter 54 and the actuating address input 47 to switch the input associated with the available address signal to the output in response to this address signal. In this embodiment the address encoding logic of the multiplexer is arranged such that it repeatedly selects inputs of the multiplexer intended for various counts. For example, if the six-input multiplexer 4 of FIG. 3 is replaced with the four-input multiplexer of FIG. 1, the address encoding logic would be such that for the address signal Zero from address counter 54 the first input of the multiplexer is selected, for the address signals One and Two the second input, for the address signal Three the third input and for the address signals Four and Five the fourth input is selected to be switched through to the input. In this manner the output signal of the multiplexer, as in the second embodiment, can also be composed without an auxiliary counter. This solution offers the advantage that the number of inputs of the multiplexer can be kept low.

A variation (not shown) of the latter embodiment consists of selecting a counter whose number of count states corresponds with the number of inputs of the multiplexer. By means of a switching logic the counter is stopped for at least one clock period at specific counts so that again the desired output signal is obtained.

We claim:

1. Digital frequency generator comprising first and second clock generators for generating respective first (2f1) and second (f2) clock signals and a frequency combining means responsive to said first and second clock generators for producing a combining means output signal (fout) having a frequency which is a function of the frequencies of the first and second clock signals, characterized in that the frequency combining means comprises:

a phase shifter means (3) for producing from the first clock signal n phase shifter output signals of the same form as each other and equally spaced apart in phase by 1/n of a period;

a multiplexer (4) having an address input, an output for supplying said combining means output signal and a plurality of signal inputs, at least n in number, fed by said n phase shifter output signals, said multiplexer having a plurality of states in which a different one of its inputs is coupled to its output in response to a corresponding address signal at its address input; and a sequence controller (5) fed by said first and second clock generators having an output, connected to the address input of the multiplexer, from which a sequence of said address signals is derived in response to the occurrence of an edge in said first clock signal, said sequence controller comprising an address counter for traversing a number of count states corresponding with the number of signal inputs of the multiplexer, said address counter (54) comprising means for producing a reset signal which is applied to a control circuit (52), which control circuit stops the address counter from changing its count state until a subsequent edge of the second clock occurs.

2. Circuit arrangement as claimed in claim 1, characterized in that said plurality of signal inputs of the multiplexer (4) comprises n inputs (41, 42, 43, 44) respectively fed by said n phase shifter output signals.

3. Circuit arrangement as claimed in claim 1, characterized in that said plurality of signal inputs of the multiplexer (4) exceeds n in number and in that at least one of said phase shifter output signals feeds more than one of said signal inputs of the multiplexer (4).

4. Circuit arrangement as claimed in claim 1, characterized in that the sequence controller comprises an auxiliary counter (53) fed by the first clock generator and feeding a clock input of the address counter (54).

5. Circuit arrangement as claimed in claim 4, characterized in that the control circuit (52), in response to said reset signal, stops the address counter (54) from changing its count state by stopping the auxiliary counter (53) from counting until said subsequent edge of the second clock occurs.

6. Digital frequency generator comprising first and second clock generators for generating respective first (2f1) and second (f2) clock signals and a frequency combining means responsive to said first and second clock generators for producing an output signal (fout) having a frequency which is the sum of the frequency of the second clock signal and one half the frequency of the first clock signal, wherein the frequency combining means comprises:

a state device (52) having a set state and a reset state;

first means for setting said state device into the set state in response to the occurrence of an edge in a predetermined direction in said second clock signal;

second means fed by said first clock signal for during said set state producing at an output of said combining means sequential cycles of a first type each spanning one and one half cycles of said first clock signal and for during said reset state producing at said output of the combining means sequential cycles of a second type each spanning two cycles of said first clock signal; and third means including a counter for after four of said sequential cycles of said first type setting said state device into the reset state.

* * * * *